(12) United States Patent
Ota

(10) Patent No.: US 8,487,388 B2
(45) Date of Patent: Jul. 16, 2013

(54) SOLID-STATE IMAGE PICKUP APPARATUS, METHOD FOR MANUFACTURING SAME, AND ELECTRONIC DEVICE

(75) Inventor: Kazunobu Ota, Kanagawa (JP)

(73) Assignee: Sony Corporation, Tokyo (JP)

( * ) Notice: Subject to any disclaimer, the term of this patent is extended or adjusted under 35 U.S.C. 154(b) by 58 days.

(21) Appl. No.: 13/105,196

(22) Filed: May 11, 2011

(65) Prior Publication Data

US 2011/0284976 A1  Nov. 24, 2011

(30) Foreign Application Priority Data

May 20, 2010 (JP) ................................. 2010-116461
Mar. 28, 2011 (JP) ................................. 2011-070424

(51) Int. Cl.
*H01L 31/02* (2006.01)
*H01L 29/84* (2006.01)
*H01L 31/18* (2006.01)

(52) U.S. Cl.
USPC ........................................................ 257/416

(58) Field of Classification Search
USPC ........ 257/416–418, E31.11, E29.324; 438/53
See application file for complete search history.

(56) References Cited

U.S. PATENT DOCUMENTS

| 7,253,488 B2 * | 8/2007 | Zhan et al. ..................... 257/414 |
| 2009/0134481 A1 * | 5/2009 | Sengupta ...................... 257/415 |
| 2009/0146227 A1 | 6/2009 | Igarishi | |

FOREIGN PATENT DOCUMENTS

| JP | 2001-004658 | 12/2001 |
| JP | 2004-153503 | 5/2009 |
| JP | 2009-139202 | 6/2009 |

* cited by examiner

Primary Examiner — Calvin Lee
Assistant Examiner — Monica D Harrison
(74) Attorney, Agent, or Firm — Dentons US LLP

(57) ABSTRACT

A solid-state image pickup apparatus includes a substrate, a solid-state image pickup device, and a Micro Electro Mechanical Systems (MEMS) device. The solid-state image pickup device and the MEMS device are configured to be formed on the same substrate.

12 Claims, 21 Drawing Sheets

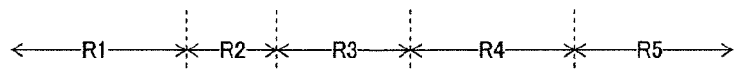

SOLID-STATE IMAGE PICKUP APPARATUS, METHOD FOR MANUFACTURING SAME, AND ELECTRONIC DEVICE

BACKGROUND

The present disclosure relates to a solid-state image pickup apparatus, a method for manufacturing the same, a designing method, and an electronic device, and particularly to a solid-state image pickup apparatus formed with a MEMS (Micro Electro Mechanical Systems) element mixed on a same chip, a method for manufacturing the same, and an electronic device.

Electronic devices such as digital video electronic devices, digital still electronic devices and the like have a solid-state image pickup apparatus such as a CCD (Charge Coupled Device) image sensor or a CMOS (Complementary Metal-Oxide-Silicon Transistor) image sensor, for example.

For example, Japanese Patent Laid-Open No. 2004-153503 (referred to as Patent Document 1, hereinafter) discloses a camera module having an angular velocity sensor part incorporated in an existing solid-state image pickup apparatus described above. Specifically, the camera module has a constitution in which an angular velocity sensor part is mounted on a casing/housing of an image pickup system part.

In the camera module of Patent Document 1, the image pickup system part and the angular velocity sensor part are integrated with each other as a camera module, but are not provided on a same chip. Thus, a mounting area and a mounting volume are increased, and it is difficult to reduce the size of the device.

For example, Japanese Patent Laid-Open No. 2009-139202 (referred to as Patent Document 2, hereinafter) discloses a semiconductor device having a CMOS circuit and a capacitance type MEMS element integrated on a same chip. While a CMOS circuit and a capacitance type MEMS element are integrated on a same chip, this constitution is not a constitution having a solid-state image pickup apparatus and a MEMS element integrated on a same chip.

For example, Japanese Patent Laid-Open No. 2001-4658 (referred to as Patent Document 3, hereinafter) shows a constitution in which a two-axis semiconductor acceleration sensor formed by a MEMS element is created by wafer lamination.

In Patent Document 3, for example, a method for manufacturing a two-axis semiconductor acceleration sensor forms a depression in at least one of the back surface of a semiconductor substrate and the main surface of a supporting substrate, and thereafter laminates the back surface side of the semiconductor substrate and the main surface side of the supporting substrate to each other. Next, the semiconductor substrate is etched to form a supporting part, a weight part, a beam, and a fixed electrode, which are made of a part of the semiconductor substrate.

A two-axis semiconductor acceleration sensor having high sensitivity can be provided by relatively simple manufacturing processes such as a process of forming a depression in a semiconductor substrate or a supporting substrate, a process of laminating the semiconductor substrate and the supporting substrate to each other, a process of etching the semiconductor substrate, and the like.

While a two-axis semiconductor acceleration sensor formed by a MEMS element is formed by wafer lamination, this constitution is not a constitution having a solid-state image pickup apparatus and a MEMS element integrated on a same chip.

SUMMARY

Disclosed herein are one or more disclosures that provide a MEMS element on a same chip as a solid-state image pickup apparatus. A device can thus be miniaturized by providing the MEMS element on the same chip as the solid-state image pickup apparatus.

According to an embodiment, a solid-state image pickup apparatus includes a substrate, a solid-state image pickup device, and a Micro Electro Mechanical Systems (MEMS) device. The solid-state image pickup device and the MEMS device are configured to be formed on the same substrate.

According to an embodiment, an electronic device includes a solid-state image pickup apparatus and a circuit to process signals generated by the solid-state image pickup device. The solid-state image pickup apparatus includes (i) a substrate, (ii) a solid-state image pickup device, and (iii) a Micro Electro Mechanical Systems (MEMS) device. The solid-state image pickup device and the MEMS device are formed on the same substrate.

According to an embodiment, a method of manufacturing a solid-state image pickup device includes designating at least a Micro Electro Mechanical Systems (MEMS) device region and a solid state image pickup region on a device substrate. A MEMS device is formed on the MEMS device region. In addition, a solid-state image pickup device is formed on the solid-state image pickup region while forming the MEMS device.

According to an embodiment, a method of manufacturing a solid-state image pickup device includes designating at least a Micro Electro Mechanical Systems (MEMS) device region and a solid state image pickup region on a device substrate. An insulating layer is formed on the device substrate. A MEMS device is formed in the MEMS device region. A solid-state image pickup device is formed in the solid-state image pickup region while forming the MEMS device. A gap is formed in the insulating layer exposing a portion of the MEMS device. A supporting substrate is secured over the MEMS device region and solid-state imaging device region. In addition, the gap, formed in the MEMS device region and exposing a portion of the MEMS device, remains in the insulating layer.

DETAILED DESCRIPTION OF THE PREFERRED EMBODIMENTS

Hereinafter, devices and constructions embodying principles of the present disclosure(s) (herein referred to as embodiments) will be described. The description will be carried out in the following order.
1. First Embodiment (Solid-state image pickup apparatus Having XY-Axis Position Sensor as MEMS Element on Same Chip)
2. Second Embodiment (Solid-state image pickup apparatus Having Z-Axis Position Sensor as MEMS Element on Same Chip)
3. Third Embodiment (Solid-state image pickup apparatus Having Microphone as MEMS Element on Same Chip)
4. First Example of Modification
5. Second Example of Modification
6. Fourth Embodiment (Application to Electronic Devices)

First Embodiment

Constitution of Solid-State Image Pickup Apparatus

A solid-state image pickup apparatus according to the present embodiment is a solid-state image pickup apparatus having an XY-axis position sensor as a MEMS element on a same chip.

An MEMS (Micro Electro Mechanical Systems) element is a minute electromechanical element, and is generally referred to also as a micromachine. For example, a MEMS element has a movable part, such as a beam, a film or the like, whose position is variable according to an inertial force, vibration or the like, and can form a sensor for sensing the inertial force or the vibration by electrically detecting the position of the beam or the film.

A MEMS element can form, for example, a position sensor for detecting XY axes with respect to an inertial force, a position sensor for detecting a Z-axis with respect to an inertial force, or a microphone for sensing the vibration of air.

The present embodiment has an XY-axis position sensor as a MEMS element as described above.

Figure 1A:
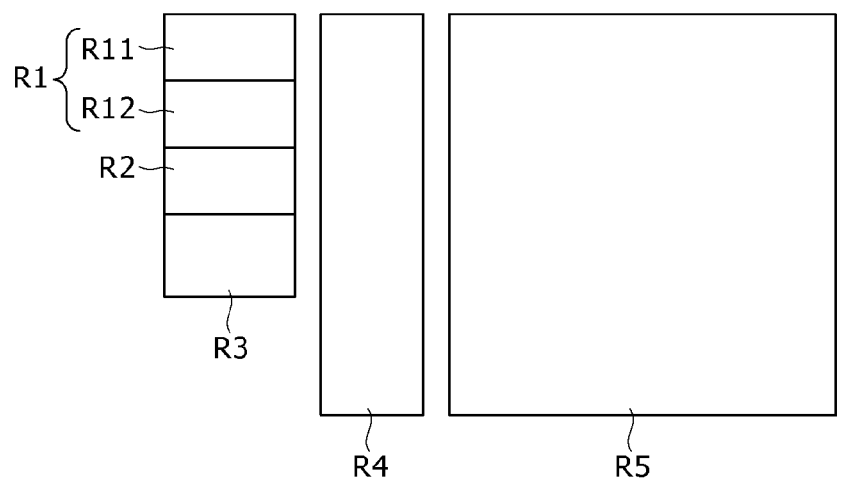
FIG. 1A is a plan view of a solid-state image pickup apparatus according to a first embodiment.
Figure 1B:
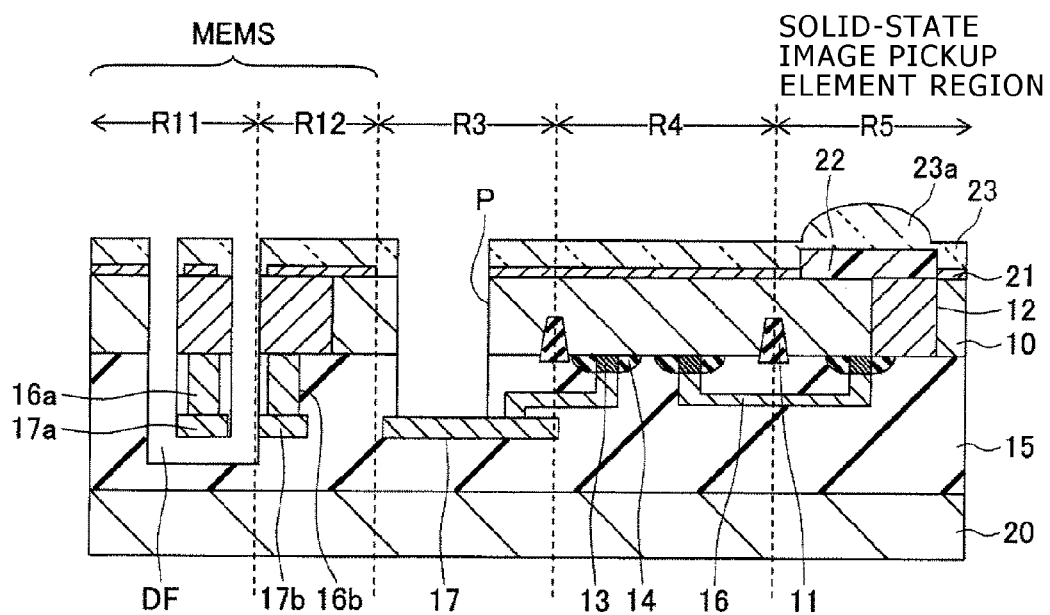
FIG. 1B is a schematic sectional view.

FIG. 1A is a plan view of the solid-state image pickup apparatus according to the first embodiment. FIG. 1B is a schematic sectional view of the solid-state image pickup apparatus according to the first embodiment.

For example, a device substrate 10 made of a silicon substrate and a supporting substrate 20 are laminated to each other with an insulating film 15 of silicon oxide or the like. A semiconductor substrate is thereby formed.

The semiconductor substrate is, for example, divided into a MEMS element region R1, a lead electrode region R2, a pad electrode region R3, a peripheral circuit region R4, and a solid-state image pickup element region R5.

For example, the MEMS element region R1 includes a vibrating electrode region R11 and a fixed electrode region R12.

For example, a vibrating electrode formed of a first conductive layer 16a and a second conductive layer 17a is embedded in the vibrating electrode region R11.

A fixed electrode formed of a first conductive layer 16b and a second conductive layer 17b is embedded in the fixed electrode region R12. The vibrating electrode and the fixed electrode form a parallel plate type capacitance element.

In this case, for example, the vibrating electrode has such a shape as to project in the form of a beam into a hollow part of a diaphragm DF structure. This structure will be described later.

For example, an STI (Shallow Trench Isolation) element isolation insulating film 11 for dividing the pad electrode region R3, the peripheral circuit region R4, the solid-state image pickup element region R5, and the like from each other is formed in a surface on the insulating film 15 side of the device substrate 10. Further, a conductive impurity diffused layer 12 is formed in necessary regions of the device substrate 10.

For example, a gate electrode 13 is formed on the insulating film 15 side of the device substrate 10 with a gate insulating film not shown in the figure interposed between the device substrate 10 and the gate electrode 13 in the peripheral circuit region R4, the solid-state image pickup element region R5, and the like. A side wall insulating film 14 is formed on both sides of the gate electrode 13.

In addition, a source and a drain not shown in the figures are formed in the device substrate 10 at regions where the side wall insulating film 14 is formed and both side parts of the side wall insulating film 14. MOS transistors are formed as described above.

For example, in the solid-state image pickup element region R5, photodiodes not shown in the figures are formed so as to be divided on a pixel-by-pixel basis in a surface of the device substrate 10 on an opposite side from the insulating film 15. A light receiving surface is formed by arranging pixels including the photodiodes in the form of a matrix.

For example, a light shielding film 21 is formed on the surface on the light receiving surface side of the device substrate 10, excluding light incidence regions of the pixels. Color filters 22 of red, green, and blue are formed for each pixel as required in the light incidence regions of the pixels.

For example, an on-chip lens 23a made of an optically transparent resin is formed on the color filters 22, and a resin layer 23 made of the material forming the on-chip lens 23a is formed on the light shielding film 21.

For example, in the pad electrode region R3, the peripheral circuit region R4, and the solid-state image pickup element region R5, upper layer wiring 16 and a pad electrode 17 connected to the gate electrodes of the MOS transistors and the like are formed so as to be embedded in the insulating film 15.

A pad opening part P is formed so as to expose the pad electrode 17 in the pad electrode region R3.

In addition, in the vibrating electrode region R11, an opening part is formed in a similar manner to that of the pad opening part P, whereby a diaphragm structure is formed.

Figure 2A:
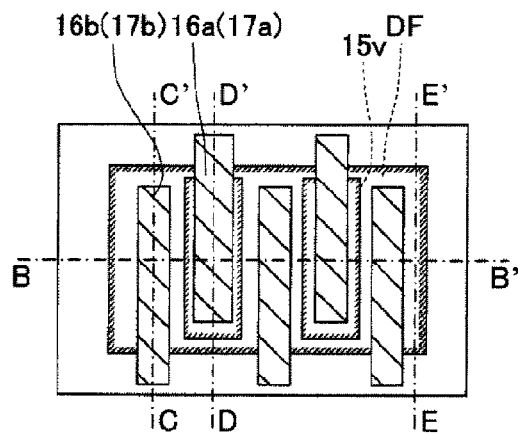
FIG. 2A is a plan view showing details of a MEMS element provided in the solid-state image pickup apparatus according to the first embodiment.
Figure 2C:
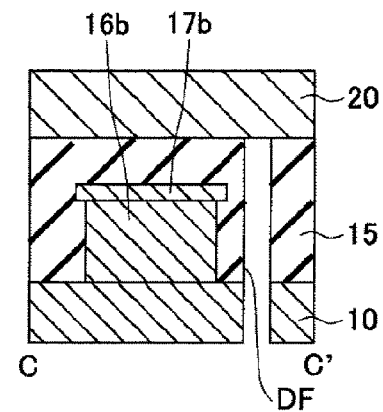
FIGS. 2B to 2E are schematic sectional views taken along lines B-B', C-C', D-D', and E-E', respectively, in FIG. 2A.

FIG. 2A is a plan view showing details of the MEMS element provided in the solid-state image pickup apparatus according to the present embodiment. FIGS. 2B to 2E are schematic sectional views taken along lines B-B', C-C', D-D', and E-E', respectively, in FIG. 2A.

The device substrate 10 and the supporting substrate 20 are laminated to each other with the insulating film 15 interposed between the device substrate 10 and the supporting substrate 20.

The first conductive layer 16a and the second conductive layer 17a forming a plate-shaped vibrating electrode and the plate-shaped first conductive layer 16b and the second conductive layer 17b forming a fixed electrode are alternately arranged in parallel with each other. While the drawings show three fixed electrodes and two vibrating electrodes arranged between the three fixed electrodes, the present disclosure is not limited to this.

The fixed electrodes and the vibrating electrodes are each embedded in the insulating film 15. In the regions of the fixed electrodes and the vibrating electrodes, opening parts are formed from the device substrate 10 side to the surface of the supporting substrate 20, whereby a diaphragm structure DF is formed.

Figure 2B:
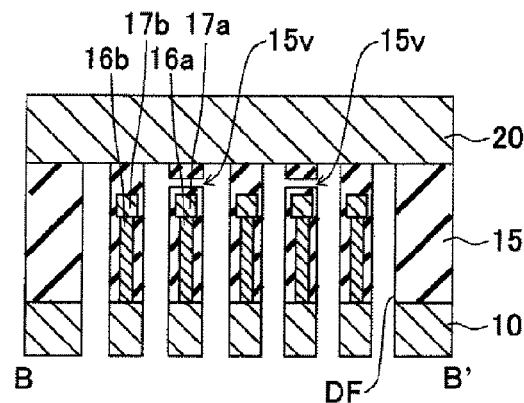
Figure 2D:
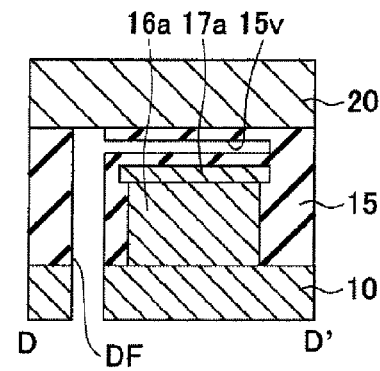
Figure 2E:
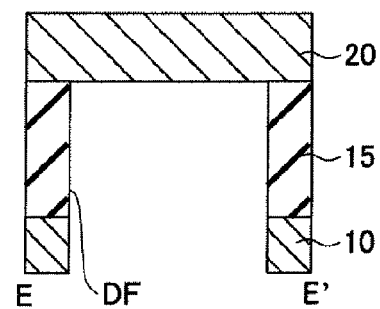

In this case, as shown in FIGS. 2B and 2D, an air gap 15v is formed so as to communicate with an air gap forming the diaphragm structure DF on the supporting substrate 20 side of the vibrating electrodes. The vibrating electrodes thereby have a beam-shaped structure whose position is variable according to an inertial force, vibration or the like.

The above-described air gap 15v is absent on the supporting substrate 20 side of the fixed electrodes. The fixed electrodes are therefore sufficiently fixed to the supporting substrate 20.

The vibrating electrodes and the fixed electrodes form a parallel plate type capacitance element. The positions of the vibrating electrodes are variable according to an inertial force, vibration or the like. Thus, the displacement of the vibrating electrodes is sensed by detecting the capacitance of the capacitance element, so that the inertial force or the vibration can be measured.

In the present embodiment, the MEMS element forms an XY-axis position sensor.

For example, a light signal obtained by receiving light by the photodiode of each pixel in the above-described solid-state image pickup element region R5 is converted into a voltage signal or the like via a floating diffusion or the like. The voltage signal is passed through a CDS (Correlated Double Sampling) circuit or the like, and then output as a pixel signal. Image data is constructed of the pixel signal output from each pixel.

Various image processing circuits are formed in the peripheral circuit region R4 as required so that the image data composed of the pixel signals obtained as described above can be subjected to image processing.

The solid-state image pickup apparatus according to the present embodiment described above enables the MEMS element to be provided on the same chip as the solid-state image pickup apparatus. Therefore the device can be miniaturized by reducing the mounting area of the device.

A method for manufacturing the solid-state image pickup apparatus according to the first embodiment will next be described.

Figure 3A:
FIGS. 3A to 3N are schematic sectional views representing manufacturing processes of a method for manufacturing the solid-state image pickup apparatus according to the first embodiment.
Figure 3B:
Figure 3C:
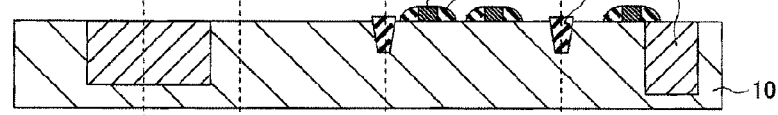
Figure 3D:
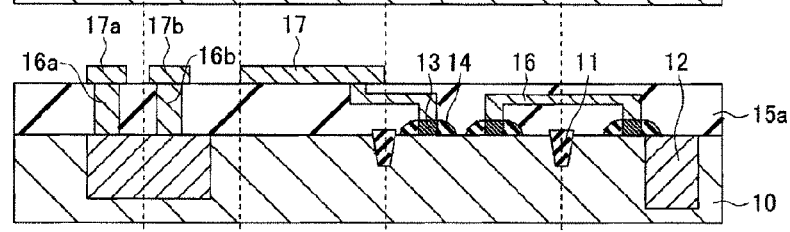
Figure 3E:
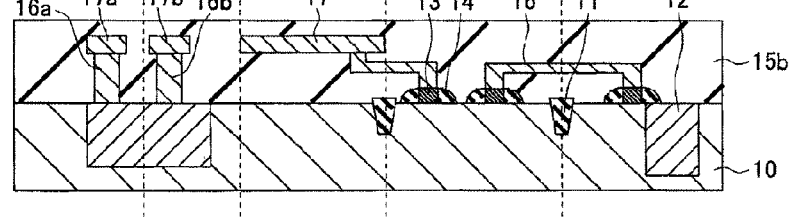
Figure 3F:
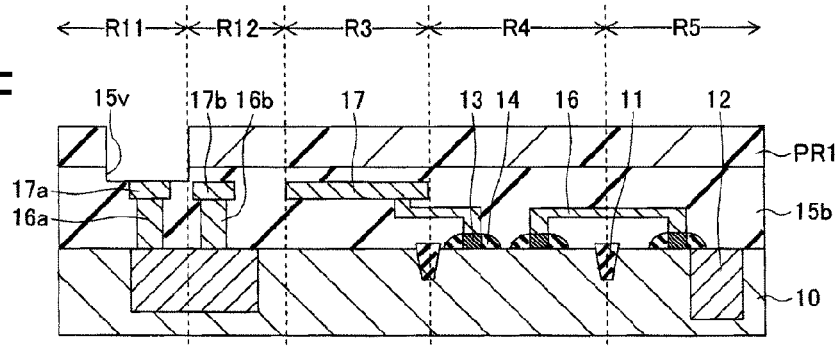
Figure 3G:
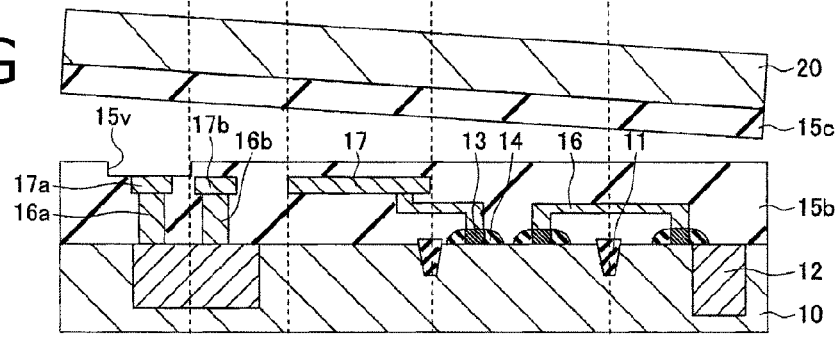
Figure 3H:
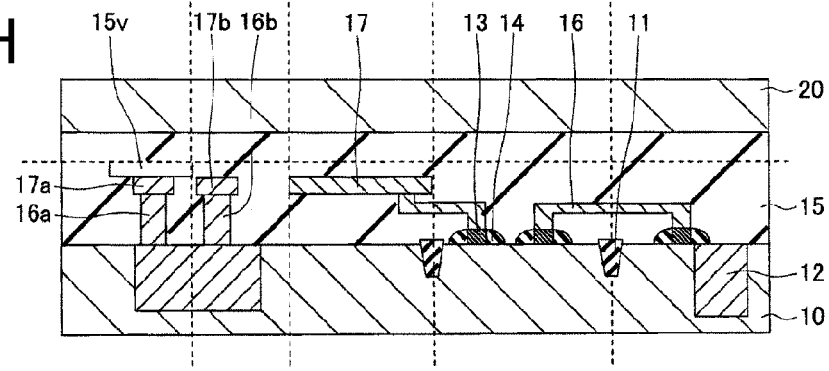
Figure 3I:
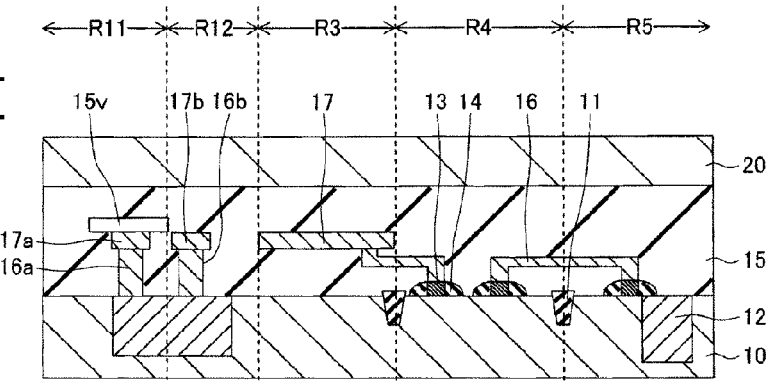
Figure 3J:
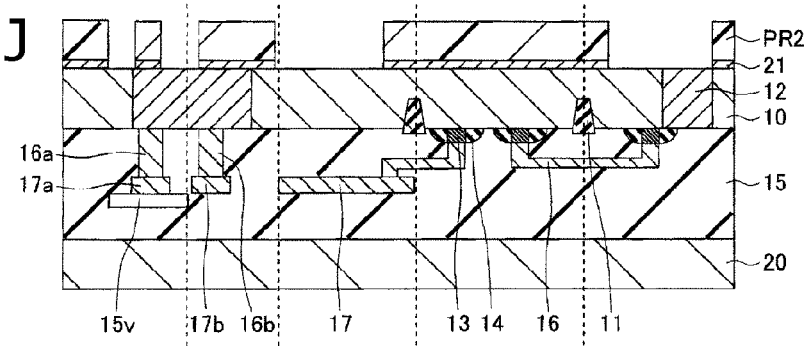
Figure 3K:
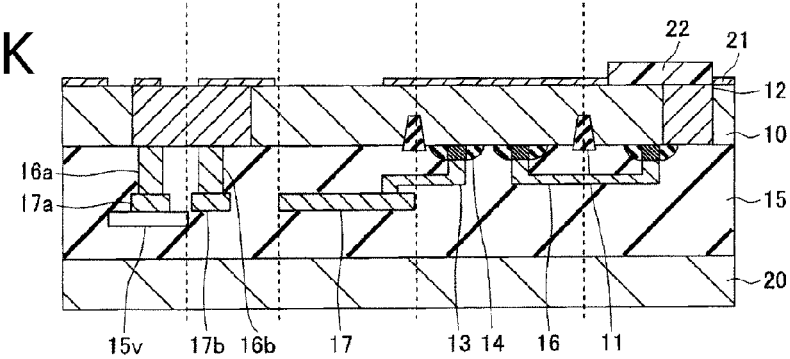
Figure 3L:
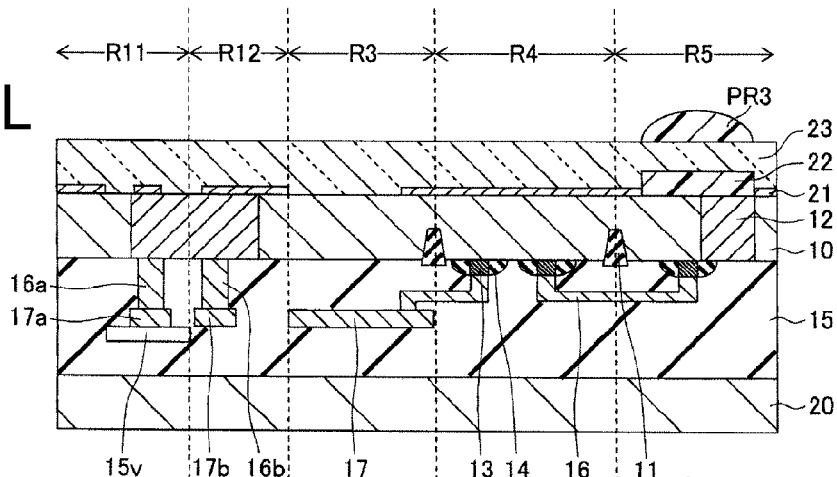
Figure 3M:
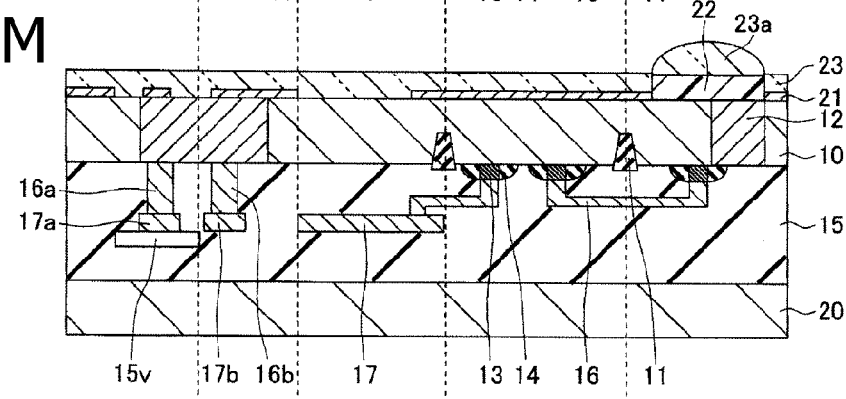
Figure 3N:
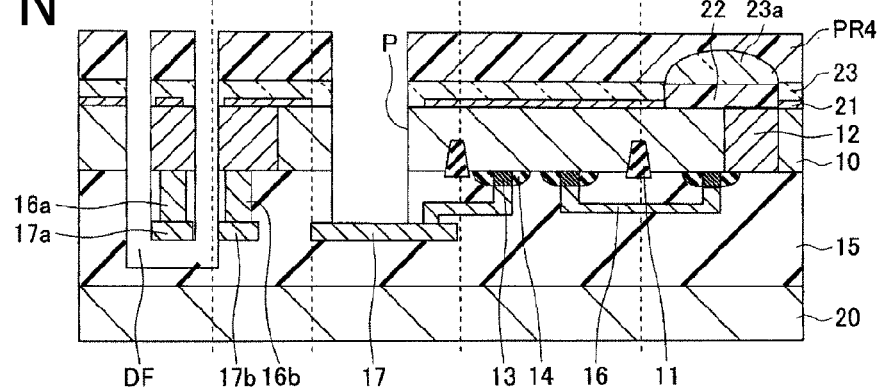

FIGS. 3A to 3N are schematic sectional views representing manufacturing processes of the method for manufacturing the solid-state image pickup apparatus according to the present embodiment.

First, as shown in FIG. 3A, an STI element isolation insulating film 11 is formed to divide the pad electrode region R3, the peripheral circuit region R4, the solid-state image pickup element region R5 and the like of the device substrate 10, for example. The depth of grooves for STI element isolation is about 0.2 to 0.5 μm. The STI element isolation insulating film 11 is formed by embedding silicon oxide or the like by a CVD (Chemical Vapor Deposition) method or the like.

Next, as shown in FIG. 3B, a conductive impurity diffused layer 12 is formed in necessary regions of the device substrate 10, for example the MEMS element region R1 (the vibrating electrode region R11 and the fixed electrode region R12), the solid-state image pickup element region R5, and the like. For example, ion implantation for pixel formation, peripheral circuit formation, and vibrating electrode formation is performed.

In this case, to reduce processes, the ion implantation for a vibrating electrode may double as ion implantation for pixel formation and peripheral circuit formation. However, only an impurity having the same polarity is ion-implanted into the vibrating electrode.

In this case, the conductive impurity may be of an N-type or a P-type. However, it is desirable to select a conductive impurity such that ion implantation is performed at as high a concentration as possible.

Next, as shown in FIG. 3C, a gate insulating film not shown in the figure and a gate electrode 13 are formed in the peripheral circuit region R4, the solid-state image pickup element region R5, and the like, for example. A conductive impurity is ion-implanted with the gate electrode 13 as a mask to form an extension region not shown in the figure.

Next, a side wall insulating film 14 is formed on both side parts of the gate electrode 13. A conductive impurity is ion-implanted with the side wall insulating film 14 as a mask to form source-drain regions.

An impurity activating process such as an RTA (Rapid Thermal Annealing) process or the like is properly performed as required. MOS transistors are formed as described above.

Next, as shown in FIG. 3D, an insulating film 15a of silicon oxide or the like is formed over an entire surface so as to cover the MOS transistors, for example.

Upper layer wiring 16 is embedded in the pad electrode region R3, the peripheral circuit region R4, and the solid-state image pickup element region R5 as appropriate in the insulating film 15. A pad electrode 17 is formed so as to be connected to the upper layer wiring 16.

In addition, in the vibrating electrode region R11 and the fixed electrode region R12, first conductive layers 16a and 16b are formed in a similar manner to the process of forming the upper layer wiring, and second conductive layers 17a and 17b are formed in a similar manner to the process of forming the pad electrode 17.

In the above, the first conductive layers 16a and 16b and the second conductive layers 17a and 17b are laid out so as to form electrodes of a parallel plate type capacitance element as shown in FIGS. 2A to 2E.

Next, as shown in FIG. 3E, silicon oxide or the like is formed over the pad electrode 17 and the second conductive layers 17a and 17b, for example. In FIG. 3E, the silicon oxide or the like is shown as an insulating film 15b integral with the above-described insulating film 15a.

Next, for example, the upper surface of the insulating film 15b is planarized by a CMP (Chemical Mechanical Polishing) process.

Next, as shown in FIG. 3F, for example, a resist film PR1 having an opening in the vibrating electrode region R11 is pattern-formed, and an anisotropic etching process such as RIE (reactive ion etching) or the like is performed with the resist film PR1 as a mask. An air gap 15v exposing the upper part of the second conductive layer 17a is thereby formed.

An amount of etching described above is a sufficient amount to prevent the upper part of the vibrating electrode from being bonded when the device substrate and the supporting substrate are bonded together.

Next, as shown in FIG. 3G, the supporting substrate 20 prepared separately is laminated to the upper surface of the insulating film 15b, for example. An insulating film 15c of silicon oxide whose surface is planarized is formed as the laminating surface of the supporting substrate 20 in advance.

Next, as shown in FIG. 3H, for example, a plasma bonding process in a range of room temperature to 400° C. is performed to make the insulating film 15b and the insulating film 15c integral with each other. In FIG. 3H, the insulating film 15b and the insulating film 15c are integrated with each other and shown as insulating film 15. The plasma bonding process is performed in a temperature range such that wiring does not sustain damage such as melting or the like.

In this process, the above-described air gap 15v remains at an interface part between the insulating film 15b and the insulating film 15c.

Next, as shown in FIG. 3I, for example, polishing and etching or the like is performed from a surface of the device substrate 10 on an opposite side from the insulating film 15 to reduce the thickness of the device substrate 10 having a plate thickness of about 700 to 800 μm to about 2 to 4 μm, which is a necessary and sufficient film thickness for an image sensor.

The figures subsequent to FIG. 3J are vertically inverted with respect to the figures up to FIG. 3I.

Next, as shown in FIG. 3J, for example, a light shielding film 21 is formed by depositing W, Al or the like on the surface of the device substrate 10 on the opposite side from the insulating film 15 by sputtering or the like.

Next, for example, a resist film PR2 having a pattern for protecting a region to be left as light shielding film is pattern-formed, and etching processing is performed with the resist film PR2 as a mask, whereby the light shielding film 21 is pattern-processed.

The pattern of the light shielding film 21 in this case has an opening in the light incidence regions of the pixels in the solid-state image pickup element region R5.

The pattern of the light shielding film 21 also has an opening in the pad electrode region R3, for example. The pattern of the light shielding film 21 also has an opening in regions on both sides of the vibrating electrode in the vibrating electrode region R11.

Next, as shown in FIG. 3K, the resist film PR2 is removed, and for example color filters 22 of red, green, and blue are formed for each pixel in the light incidence regions of the pixels from which regions the light shielding film is removed in the solid-state image pickup element region R5. The color filters 22 are formed into a predetermined pattern by for example applying color filter materials and performing pattern exposure.

Next, as shown in FIG. 3L, for example, an optically transparent resin layer 23 is applied, and a resist film PR3 for on-chip lens formation is formed.

The resist film PR3 can be formed by, for example, forming an ordinary resist film, thereafter pattern-processing the resist film so as to leave an on-chip lens region, and melting the resist film by thermal treatment to make the resist film have a surface in a spherical shape due to surface tension.

Next, as shown in FIG. 3M, the entire surface is etched back by a dry etching process, and the shape of the resist film PR3 is transferred to the surface of the resin layer 23, whereby an on-chip lens 23a is formed.

Next, as shown in FIG. 3N, a resist film PR4 in a pattern having an opening in a pad opening part is pattern-formed, and the pad opening part P is formed by performing a dry etching process to expose the pad electrode 17.

In this case, the resist film PR4 is in a pattern having an opening in regions on both sides of the vibrating electrode in the vibrating electrode region R11. Thereby, the above-described etching process forms opening parts communicating with the air gap 15v in the vibrating electrode region R11, and thus forms a diaphragm structure DF.

The above-described etching is performed so as not to remove the pad electrode. The etching is performed so as to reach the air gap 15v associated with the vibrating electrode.

The resist film PR4 for the pad opening is removed.

Subsequent manufacturing is performed in a similar manner to a method for manufacturing a typical solid-state image pickup apparatus.

Thus, the solid-state image pickup apparatus having the MEMS element mixed on the same substrate, as shown in FIG. 1B, can be manufactured.

According to the method for manufacturing the solid-state image pickup apparatus according to the first embodiment, the MEMS element can be easily formed on the same chip as the solid-state image pickup apparatus, and the device can be miniaturized by reducing the mounting area of the device.

For example, in a camera module of the constitution of Patent Document 1, a solid-state image pickup apparatus and a MEMS element such as a position sensor or the like are created separately from each other, and the camera module is created by mounting each of the solid-state image pickup apparatus and the MEMS element. Therefore a decrease in yield occurs when each chip is mounted. In addition, a position controlling circuit for the position sensor and a circuit for image processing of the solid-state image pickup apparatus need to be provided separately from each other. Thus, the chip area of each chip is increased, and manufacturing cost is increased.

When position control for hand movement blur correction of the camera module is to be performed according to image data generated by the solid-state image pickup apparatus and position information generated by the position sensor, wiring for transmitting information between the solid-state image pickup apparatus and the position sensor is necessary, so that the cost of manufacturing the module is increased.

The solid-state image pickup apparatus according to the present embodiment has the MEMS element formed or combined on the same chip as the solid-sate image pickup device, and is thus able to suppress the decrease in yield as compared with the case where the solid-state image pickup apparatus and the MEMS element such as the position sensor or the like are created separately from each other and formed into a module by mounting.

In addition, manufacturing cost can be decreased by reducing chip area.

In addition, wiring for transmitting information between the solid-state image pickup apparatus and the MEMS element as position sensor can be housed within the same chip, so that manufacturing cost can be reduced.

Second Embodiment

Constitution of Solid-State Image Pickup Apparatus

A solid-state image pickup apparatus according to the second embodiment is a solid-state image pickup apparatus having a Z-axis position sensor as a MEMS element on a same chip.

The solid-state image pickup apparatus according to the second embodiment basically has a similar constitution to that of the first embodiment, but is different from the first embodiment in that the MEMS element is a Z-axis position sensor.

Figure 4:
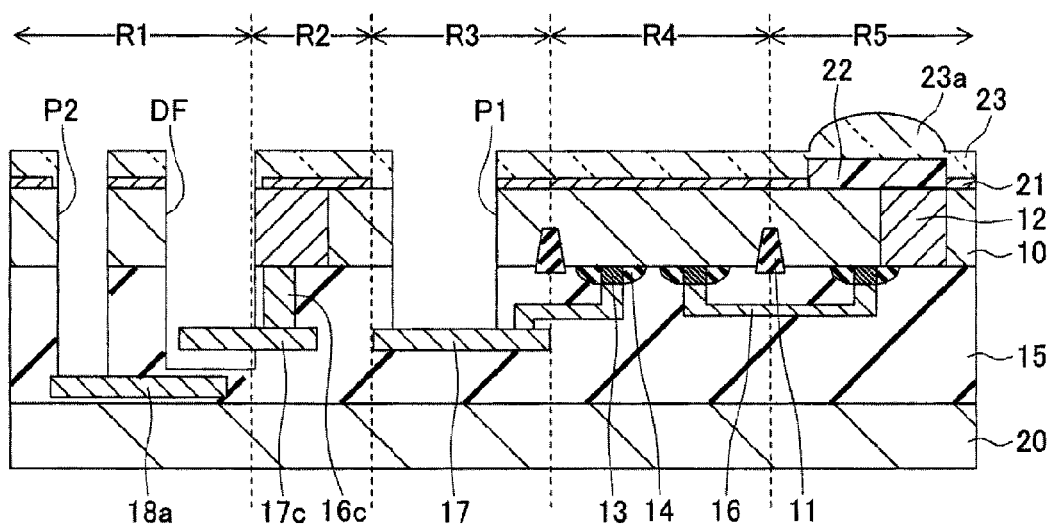
FIG. 4 is a schematic sectional view of a solid-state image pickup apparatus according to a second embodiment.

FIG. 4 is a schematic sectional view of the solid-state image pickup apparatus according to the second embodiment.

For example, a device substrate 10 made of a silicon substrate and a supporting substrate 20 are laminated to each other with an insulating film 15 of silicon oxide or the like interposed between the device substrate 10 and the supporting substrate 20. A semiconductor substrate is thereby formed.

The semiconductor substrate is, for example, divided into a MEMS element region R1, a lead electrode region R2, a pad electrode region R3, a peripheral circuit region R4, and a solid-state image pickup element region R5.

For example, in the MEMS element region R1, a vibrating electrode 17c and a fixed electrode 18a are embedded so as to be parallel with the substrates.

The vibrating electrode 17c and the fixed electrode 18a form a parallel plate type capacitance element.

In the lead electrode region R2, a conductive layer 16c connected to the vibrating electrode 17c is embedded in the insulating film 15.

In this case, for example, the vibrating electrode 17c has such a shape as to project in the form of a beam into a hollow part of a diaphragm DF structure.

Figure 5A:
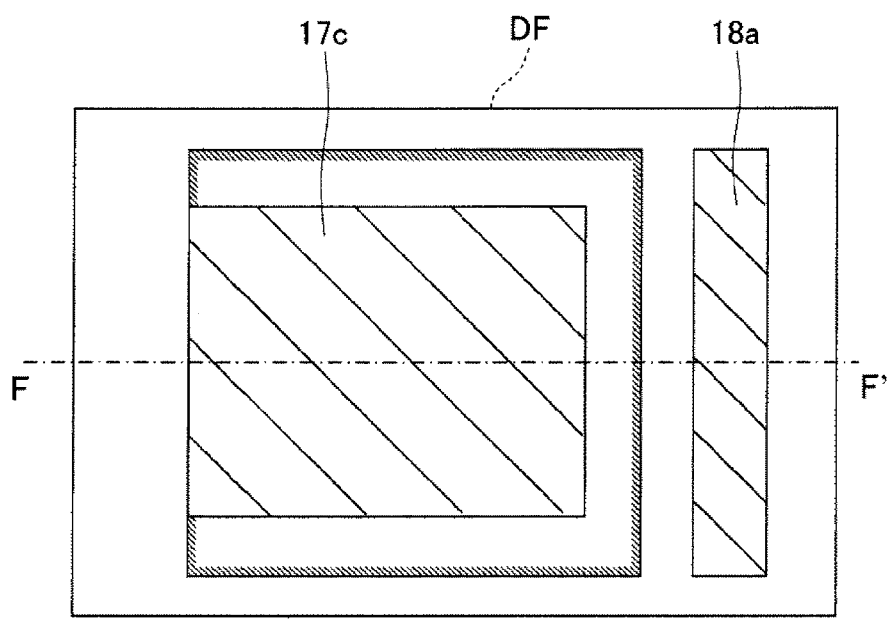
FIG. 5A is a plan view showing details of a MEMS element provided in the solid-state image pickup apparatus according to the second embodiment.
Figure 5B:
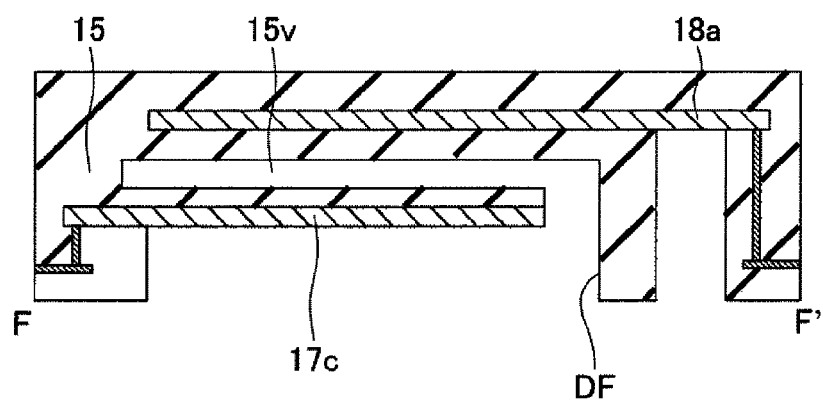
FIG. 5B is a schematic sectional view taken along a line F-F' in FIG. 5A.

FIG. 5A is a plan view showing details of the MEMS element provided in the solid-state image pickup apparatus according to the second embodiment. FIG. 5B is a schematic sectional view taken along a line F-F' in FIG. 5A.

The vibrating electrode 17c and the fixed electrode 18a are embedded in the insulating film 15 to which the device substrate and the supporting substrate are laminated. An opening part is formed from the side of the vibrating electrode 17c to the vicinity of the fixed electrode 18a, whereby a diaphragm structure DF is formed.

In this case, as shown in FIG. 5B, an air gap 15v is formed between the vibrating electrode 17c and the fixed electrode 18a so as to communicate with the diaphragm structure DF. The vibrating electrode 17c thereby has a beam-shaped structure whose position is variable according to an inertial force, vibration or the like.

A connection from the side of the vibrating electrode 17c to the fixed electrode 18a is made by wiring or the like.

The vibrating electrode and the fixed electrode form a parallel plate type capacitance element. The position of the vibrating electrode is variable according to an inertial force, vibration or the like. Thus, the displacement of the vibrating electrode is sensed by detecting the capacitance of the capacitance element, so that the inertial force or the vibration can be measured.

In the present embodiment, the MEMS element forms a Z-axis position sensor.

The solid-state image pickup apparatus, described above, enables the MEMS element to be provided on the same chip as the solid-state image pickup apparatus. Therefore the device can be miniaturized by reducing the mounting area of the device.

A method for manufacturing the solid-state image pickup apparatus according to the second embodiment will next be described.

Figure 6A:
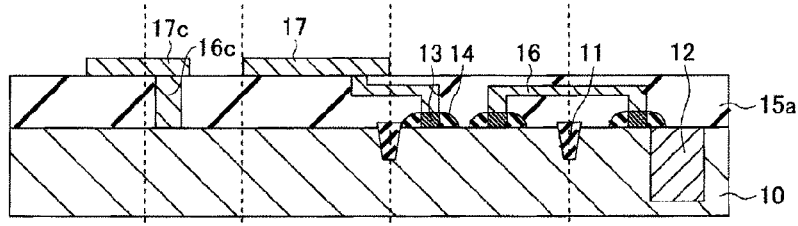
FIGS. 6A to 6R are schematic sectional views representing manufacturing processes of a method for manufacturing the solid-state image pickup apparatus according to the second embodiment.
Figure 6B:
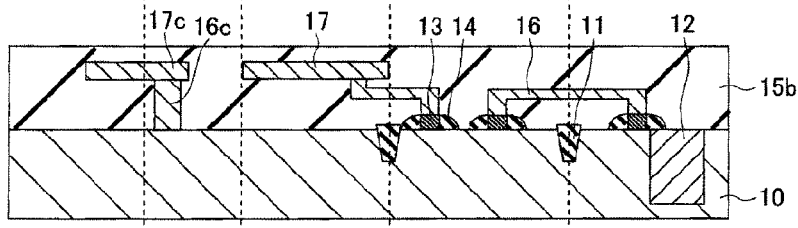
Figure 6C:
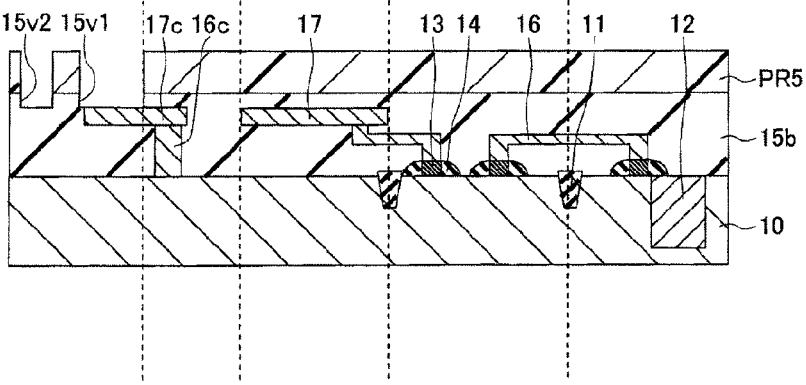
Figure 6D:
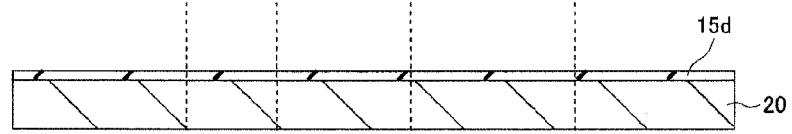
Figure 6E:
Figure 6F:
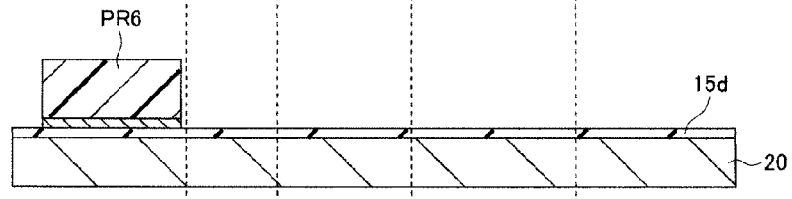
Figure 6G:
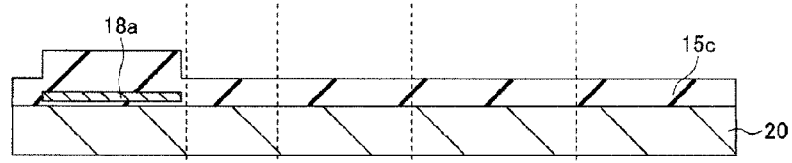
Figure 6H:
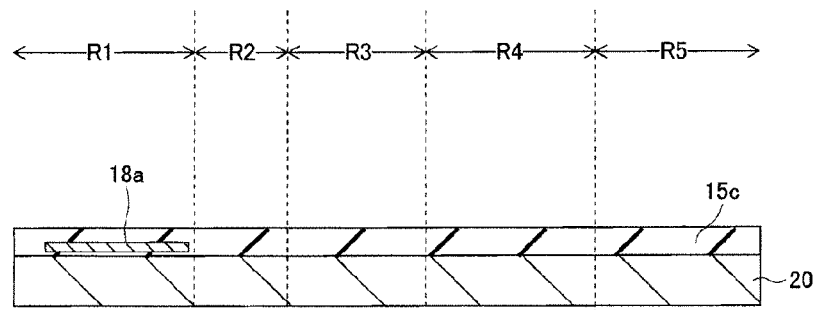
Figure 6I:
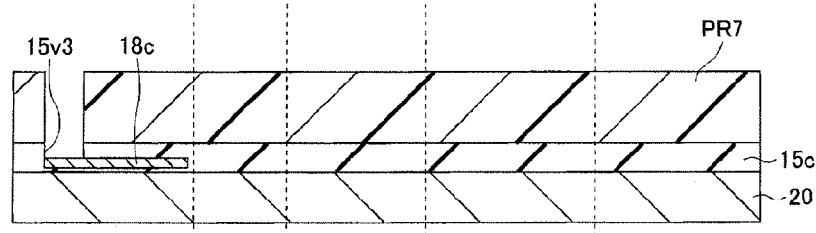
Figure 6J:
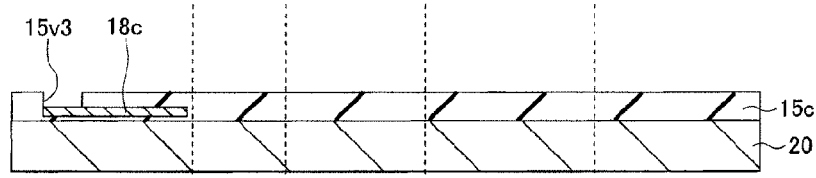
Figure 6K:
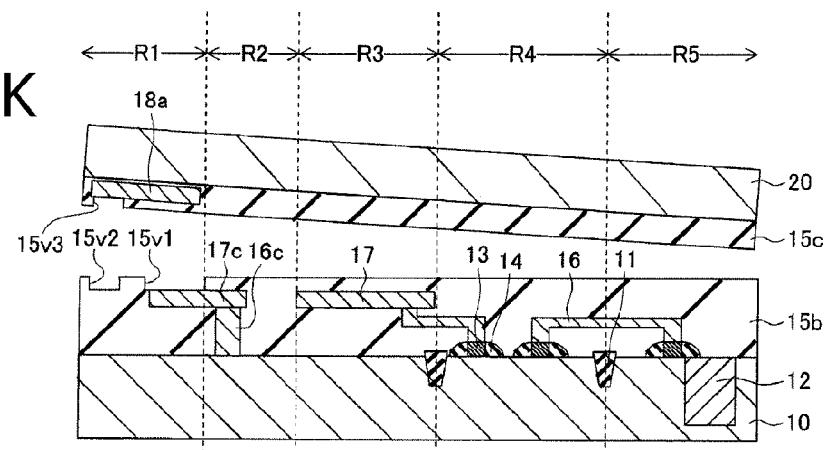
Figure 6L:
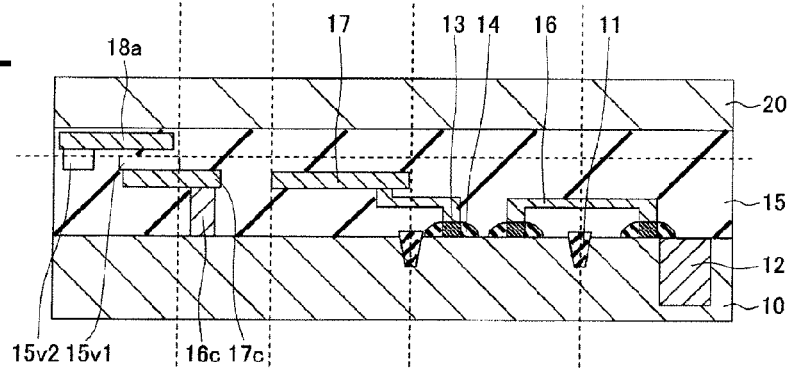
Figure 6M:
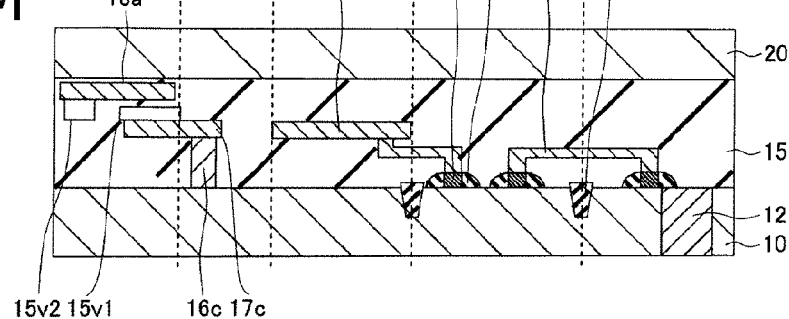
Figure 6N:
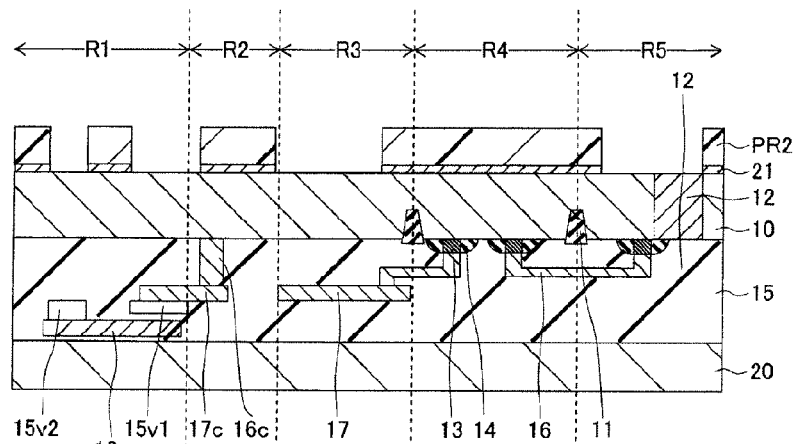
Figure 6O:
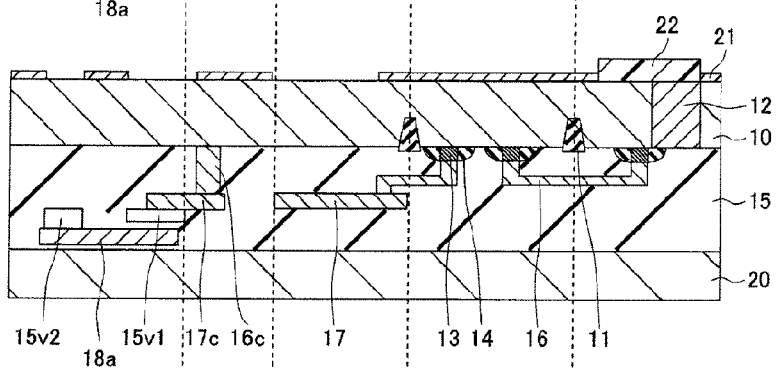
Figure 6P:
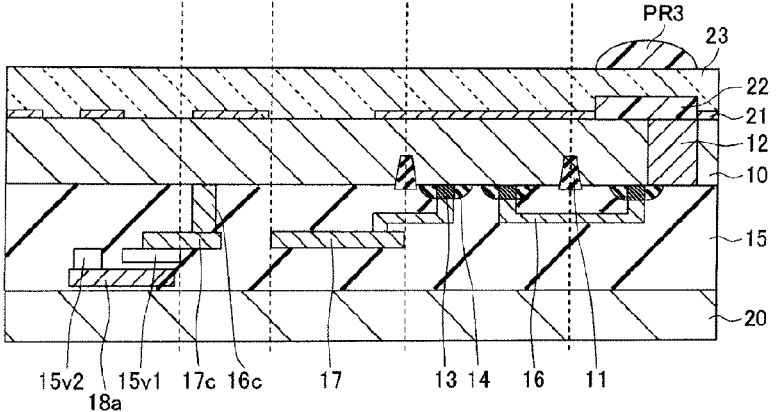
Figure 6Q:
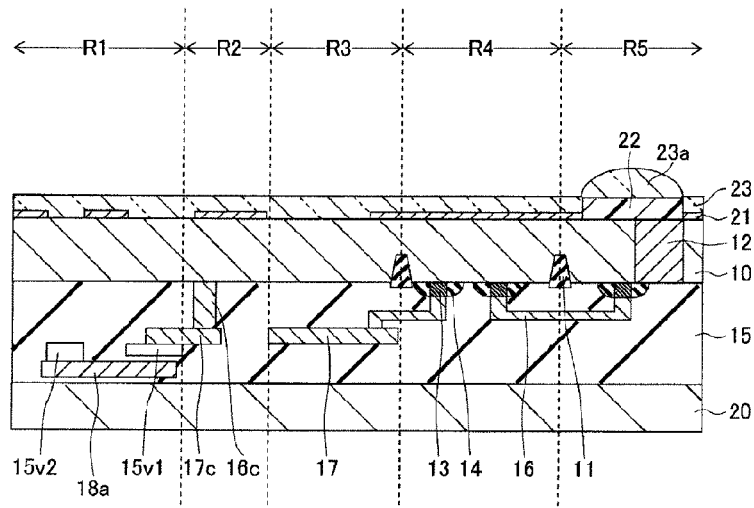
Figure 6R:
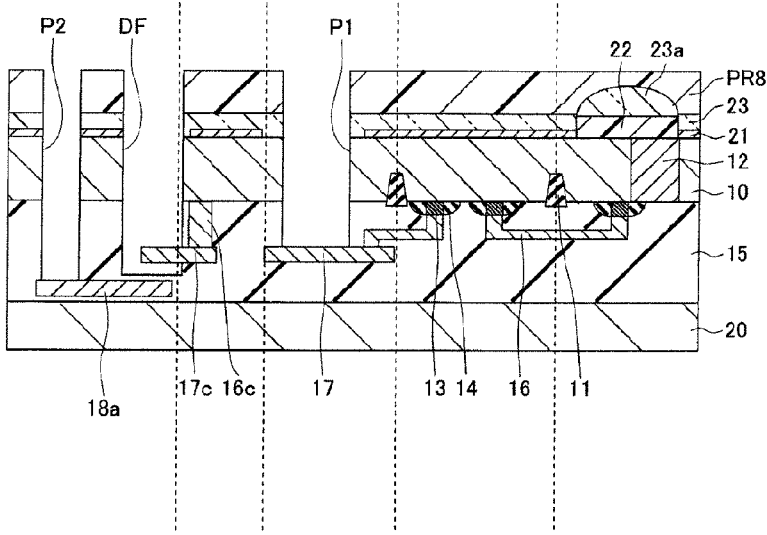

FIGS. 6A to 6R are schematic sectional views representing manufacturing processes of the method for manufacturing the solid-state image pickup apparatus according to the second embodiment.

First, processes up to FIG. 6A are performed in a similar manner to that of the first embodiment.

However, a vibrating electrode 17c is formed in the MEMS element region R1, and a conductive layer 16c connected to the vibrating electrode 17c is formed in the lead electrode region R2.

Next, as shown in FIG. 6B, for example, silicon oxide or the like is formed over a pad electrode 17 and the vibrating electrode 17c. In FIG. 6B, the silicon oxide or the like is shown as an insulating film 15b integral with an insulating film 15a in FIG. 6A.

Next, for example, the upper surface of the insulating film 15b is planarized by a CMP (Chemical Mechanical Polishing) process.

Next, as shown in FIG. 6C, for example, a resist film PR5 having an opening in the MEMS element region R1 is pattern-formed, and an anisotropic etching process such as RIE (reactive ion etching) or the like is performed with the resist film PR5 as a mask. An air gap 15v1 exposing the upper part of the vibrating electrode 17c is thereby formed.

In addition, an air gap 15v2 is similarly formed by making an opening in a part of the MEMS element region R1 in which part the vibrating electrode 17c is not formed. The air gap 15v2 is formed so as to be aligned with an air gap 15v3 to be described later.

An amount of etching described above is a sufficient amount to prevent the upper part of the vibrating electrode from being bonded when the device substrate and the supporting substrate are bonded together.

Meanwhile, the supporting substrate is prepared separately.

For example, as shown in FIG. 6D, an insulating film 15d is formed by depositing silicon oxide on the supporting substrate 20 by a CVD method or the like.

Next, as shown in FIG. 6E, a conductive layer 18 of Al, AlSi, AlCu or the like is formed on the insulating film 15d by a sputtering method.

Next, as shown in FIG. 6F, for example, a resist film PR6 having a pattern for protecting a region to be left as fixed electrode is pattern-formed, and the conductive layer 18 is pattern-processed, whereby the fixed electrode 18a is formed.

Next, as shown in FIG. 6G, for example, silicon oxide or the like is formed over the fixed electrode 18a. In FIG. 6G, the silicon oxide or the like is shown as an insulating film 15c integral with the insulating film 15d in FIG. 6F.

Next, as shown in FIG. 6H, for example, the upper surface of the insulating film 15c is planarized by a CMP process.

Next, as shown in FIG. 6I, for example, a resist film PR7 having an opening in a position aligned with the above-described air gap 15v2 is pattern-formed, and an anisotropic etching process such as RIE (reactive ion etching) or the like is performed with the resist film PR7 as a mask. An air gap 15v3 exposing the upper part of the fixed electrode 18a is thereby formed.

Next, as shown in FIG. 6J, the resist film PR7 is removed.

Next, as shown in FIG. 6K, for example, the above-described supporting substrate 20 is laminated to the upper surface of the insulating film 15b from the side of the insulating film 15c.

Next, as shown in FIG. 6L, for example, a plasma bonding process in a range of room temperature to 400° C. is performed to make the insulating film 15b and the insulating film 15c integral with each other. In FIG. 6L, the insulating film 15b and the insulating film 15c are integrated with each other and shown as insulating film 15. The plasma bonding process is performed in a temperature range such that wiring does not sustain damage such as melting or the like.

In this process, the above-described air gap 15v1 remains at an interface part between the insulating film 15b and the insulating film 15c. In addition, the air gap 15v2 and the air gap 15v3 formed so as to be aligned with each other are integrated into one air gap 15v2.

Next, as shown in FIG. 6M, for example, polishing and etching or the like is performed from a surface of the device substrate 10 on an opposite side from the insulating film 15 to reduce the thickness of the device substrate 10 having a plate thickness of about 700 to 800 μm to about 2 to 4 μm, which is a necessary and sufficient film thickness for an image sensor.

The figures subsequent to FIG. 6N are vertically inverted with respect to the figures up to FIG. 6M.

Next, as shown in FIG. 6N, for example, a light shielding film 21 is formed by depositing W, Al or the like on the surface of the device substrate 10 on the opposite side from the insulating film 15 by sputtering or the like.

Next, for example, a resist film PR2 having a pattern for protecting a region to be left as light shielding film is pattern-formed, and etching processing is performed with the resist film PR2 as a mask, whereby the light shielding film 21 is pattern-processed.

The pattern of the light shielding film 21 in this case has an opening in the light incidence regions of pixels in the solid-state image pickup element region R5.

The pattern of the light shielding film 21 also has an opening in the pad electrode region R3, for example. The pattern of the light shielding film 21 also has an opening in the region of the vibrating electrode 17c and the region of the air gap 15v2 in the MEMS element region R1.

Next, as shown in FIG. 6O, the resist film PR2 is removed, and for example color filters 22 of red, green, and blue are formed for each pixel in the light incidence regions of the pixels from which regions the light shielding film is removed in the solid-state image pickup element region R5. The color filters 22 are formed into a predetermined pattern by, for example, applying color filter materials and performing pattern exposure.

Next, as shown in FIG. 6P, for example, an optically transparent resin layer 23 is applied, and a resist film PR3 for on-chip lens formation is formed.

The resist film PR3 can be formed by, for example, forming an ordinary resist film, thereafter pattern-processing the resist film so as to leave an on-chip lens region, and melting the resist film by thermal treatment to make the resist film have a surface in a spherical shape due to surface tension.

Next, as shown in FIG. 6Q, the entire surface is etched back by a dry etching process, and the shape of the resist film PR3 is transferred to the surface of the resin layer 23, whereby an on-chip lens 23a is formed.

Next, as shown in FIG. 6R, a resist film PR8 in a pattern having an opening in a pad opening part is pattern-formed, and the pad opening part P1 is formed by performing a dry etching process to expose the pad electrode 17.

In this case, the resist film PR8 is in a pattern having an opening in the region of the vibrating electrode 17c and the region of the air gap 15v2 in the MEMS element region R1. Thereby, the above-described etching process forms an opening part communicating with the air gap 15v1 in the MEMS element region R1, and thus forms a diaphragm structure DF.

In addition, a pad opening part P2 for the fixed electrode 18a is formed, the pad opening part P2 reaching the air gap 15v2.

The above-described etching is performed so as not to remove the pad electrode 17 or the vibrating electrode 17c and so as to reach the air gaps 15v1 and 15v2.

The resist film PR8 for the pad opening is removed.

Subsequent manufacturing is performed in a similar manner to a method for manufacturing an ordinary solid-state image pickup apparatus.

Thus, the solid-state image pickup apparatus having the MEMS element formed or combined on the same substrate as the solid-state image pickup device, as shown in FIG. 4, can be manufactured.

According to the method for manufacturing the solid-state image pickup apparatus according to the second embodiment, the MEMS element can be easily formed on the same chip as the solid-state image pickup apparatus, and the device can be miniaturized by reducing the mounting area of the device.

Third Embodiment

Constitution of Solid-State Image Pickup Apparatus

A solid-state image pickup apparatus according to the third embodiment is a solid-state image pickup apparatus having a microphone as a MEMS element on a same chip.

The solid-state image pickup apparatus according to the third embodiment basically has a similar constitution to that of the first embodiment, but is different from the first embodiment in that the MEMS element is a microphone.

Figure 7:
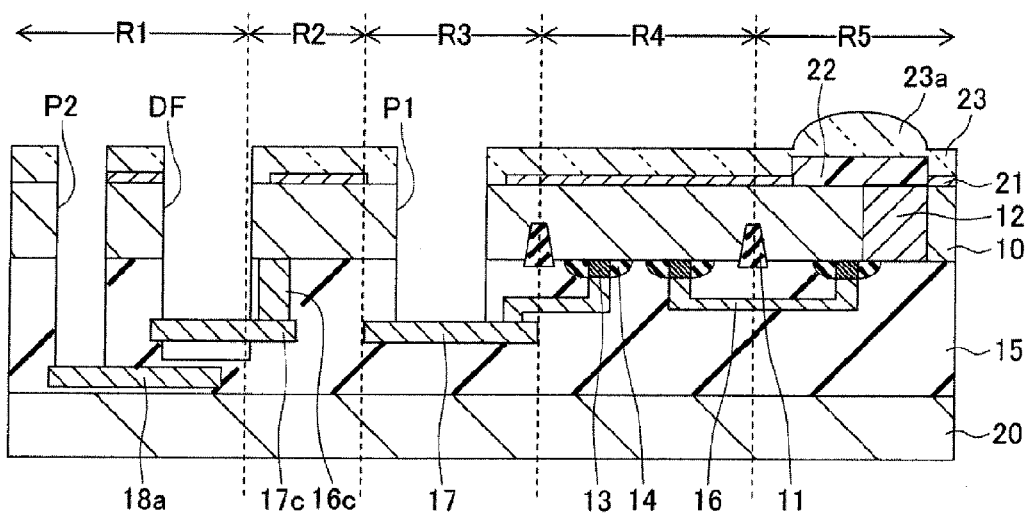
FIG. 7 is a schematic sectional view of a solid-state image pickup apparatus according to a third embodiment.

FIG. 7 is a schematic sectional view of the solid-state image pickup apparatus according to the third embodiment.

For example, a device substrate 10 made of a silicon substrate and a supporting substrate 20 are laminated to each other with an insulating film 15 of silicon oxide or the like interposed between the device substrate 10 and the supporting substrate 20. A semiconductor substrate is thereby formed.

The semiconductor substrate is for example divided into a MEMS element region R1, a lead electrode region R2, a pad electrode region R3, a peripheral circuit region R4, and a solid-state image pickup element region R5.

For example, in the MEMS element region R1, a vibrating electrode 17c and a fixed electrode 18a are embedded so as to be parallel with the substrates.

The vibrating electrode 17c and the fixed electrode 18a form a parallel plate type capacitance element.

In the lead electrode region R2, a conductive layer 16c connected to the vibrating electrode 17c is embedded in the insulating film 15.

In this case, for example, the vibrating electrode 17c is formed by a film extended with a gap from a bottom part of a hollow part of a diaphragm DF structure.

Figure 8A:
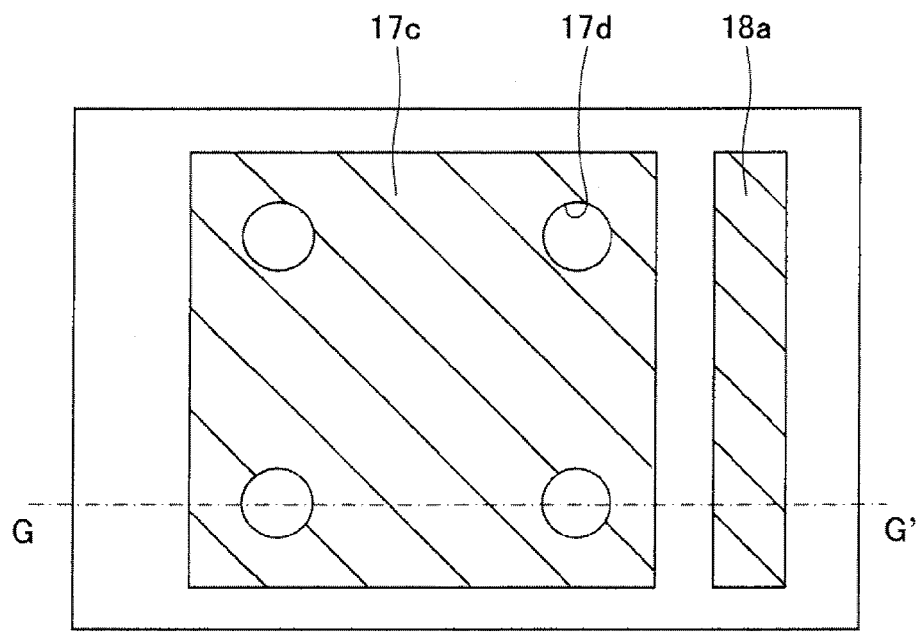
FIG. 8A is a plan view showing details of a MEMS element provided in the solid-state image pickup apparatus according to the third embodiment.
Figure 8B:
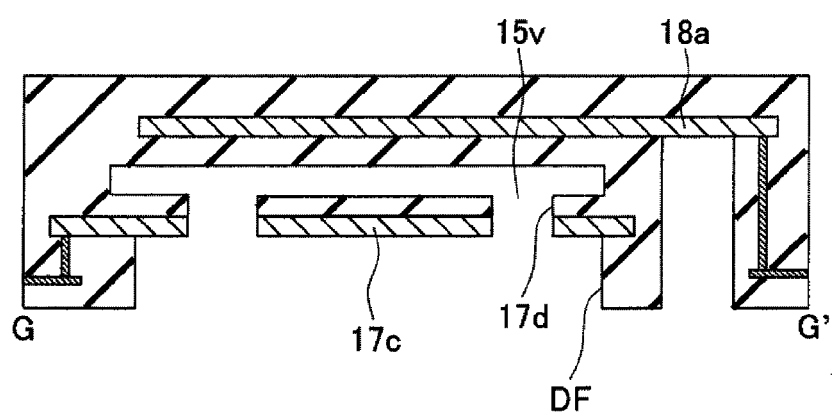
FIG. 8B is a schematic sectional view taken along a line G-G' in FIG. 8A.

FIG. 8A is a plan view showing details of the MEMS element provided in the solid-state image pickup apparatus according to the third embodiment. FIG. 8B is a schematic sectional view taken along a line G-G' in FIG. 8A.

The vibrating electrode 17c and the fixed electrode 18a are embedded in the insulating film 15 to which the device substrate and the supporting substrate are laminated. An opening part is formed from the side of the vibrating electrode 17c to the vicinity of the fixed electrode 18a, whereby a diaphragm structure DF is formed.

In this case, as shown in FIG. 8B, an opening 17d in a circular shape, for example, is formed in a part of the vibrating electrode 17c, and an air gap 15v is formed between the vibrating electrode 17c and the fixed electrode 18a so as to communicate with the diaphragm structure DF. The vibrating electrode 17c thereby has a film-shaped structure whose position is variable according to vibration or the like.

A connection from the side of the vibrating electrode 17c to the fixed electrode 18a is made by wiring or the like.

The vibrating electrode and the fixed electrode form a parallel plate type capacitance element. The position of the vibrating electrode is variable according to vibration or the like. Thus, the displacement of the vibrating electrode is sensed by detecting the capacitance of the capacitance element, so that the vibration of an air can be measured.

As described in the above embodiment, the MEMS element forms a microphone.

The solid-state image pickup apparatus, described above, enables the MEMS element to be provided on the same chip as the solid-state image pickup apparatus. Therefore the device can be miniaturized by reducing the mounting area of the device.

A method for manufacturing the solid-state image pickup apparatus will next be described.

FIGS. 9A to 9D are schematic sectional views representing manufacturing processes of the method for manufacturing the solid-state image pickup apparatus according to the third embodiment.

Figure 9A:
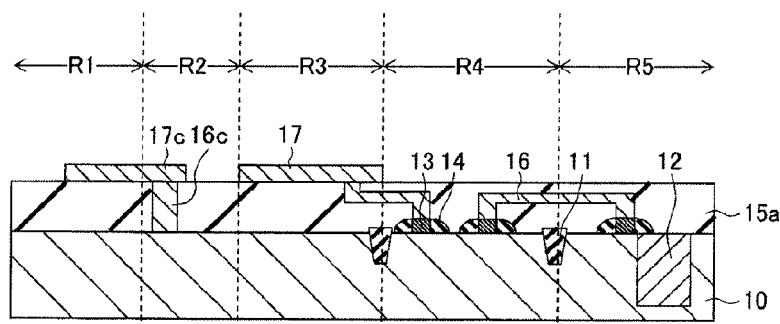
FIGS. 9A to 9D are schematic sectional views representing manufacturing processes of a method for manufacturing the solid-state image pickup apparatus according to the third embodiment.

First, processes up to FIG. 9A are performed in a similar manner to that of the first embodiment.

However, a vibrating electrode 17c is formed in the MEMS element region R1, and a conductive layer 16c connected to the vibrating electrode 17c is formed in the lead electrode region R2.

Figure 9B:
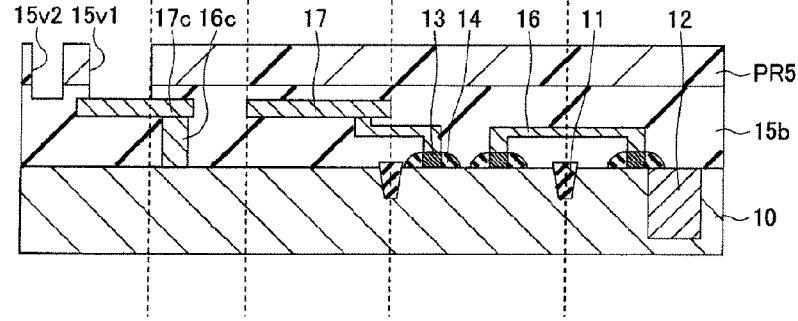

Next, as shown in FIG. 9B, for example, silicon oxide or the like is formed over a pad electrode 17 and the vibrating electrode 17c. In FIG. 9B, the silicon oxide or the like is shown as an insulating film 15b integral with an insulating film 15a in FIG. 9A.

Next, for example, the upper surface of the insulating film 15b is planarized by a CMP (Chemical Mechanical Polishing) process.

Next, for example, a resist film PR5 having an opening in the MEMS element region R1 is pattern-formed, and an anisotropic etching process such as RIE (reactive ion etching) or the like is performed with the resist film PR5 as a mask. An air gap 15v1 exposing the upper part of the vibrating electrode 17c is thereby formed.

In addition, an air gap 15v2 is similarly formed by making an opening in a part of the MEMS element region R1 in which part the vibrating electrode 17c is not formed. The air gap 15v2 is formed so as to be aligned with an air gap 15v3 to be described later.

An amount of etching described above is a sufficient amount to prevent the upper part of the vibrating electrode from being bonded when the device substrate and the supporting substrate are bonded together.

Meanwhile, as in the second embodiment, the supporting substrate 20 is prepared separately in the present embodiment.

For example, an insulating film is formed on the supporting substrate 20, a fixed electrode 18a is embedded in the insulating film, and further an air gap 15v3 is formed in the insulating film.

Figure 9C:
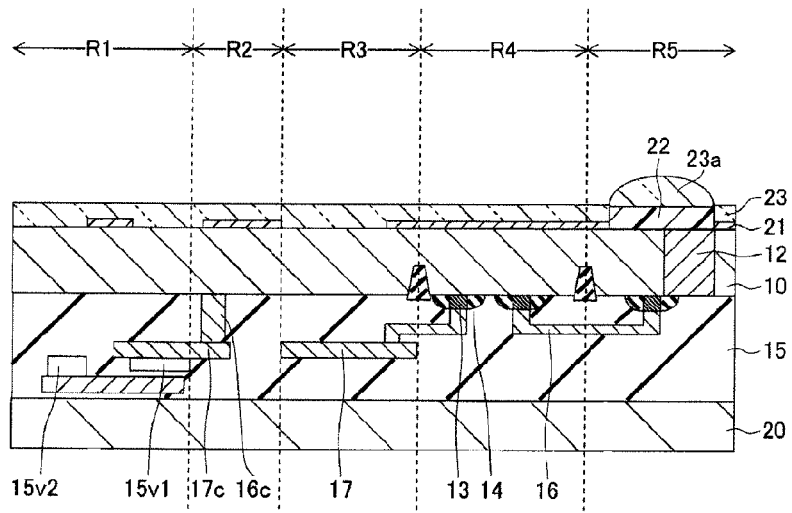

Next, as shown in FIG. 9C, for example, the above-described supporting substrate 20 is laminated to the upper surface of the insulating film 15b from the side of the insulating film 15c, and a plasma bonding process in a range of room temperature to 400° C. is performed to integrate the insulating film 15b and the insulating film 15c into an insulating film 15. The air gap 15v2 and the air gap 15v3, formed so as to be aligned with each other, are integrated into one air gap 15v2.

Further, for example, the thickness of the device substrate 10 is reduced from a surface of the device substrate 10 on an opposite side from the insulating film 15, and a light shielding film 21 is pattern-formed by depositing W, A1 or the like on the surface of the device substrate 10 on the opposite side from the insulating film 15. Next, a color filter 22 and an on-chip lens 23a are formed.

Figure 9D:
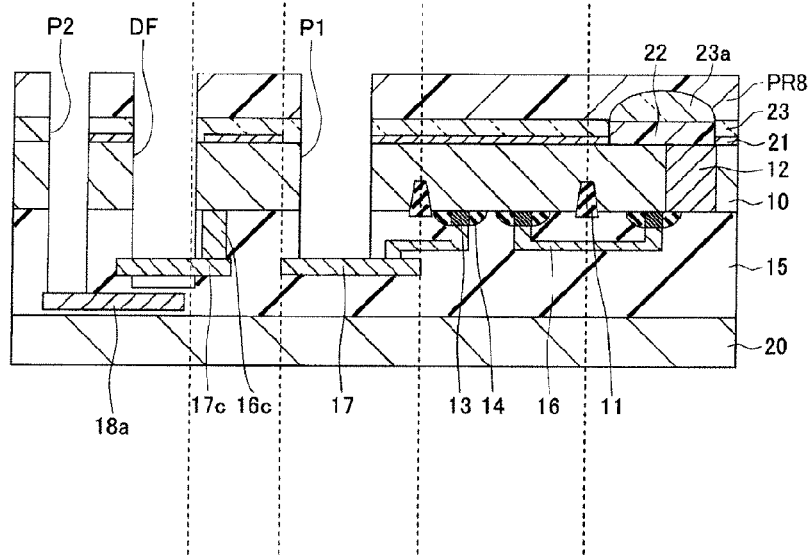

Next, as shown in FIG. 9D, a resist film PR8 in a pattern having an opening in a pad opening part is pattern-formed, and the pad opening part P1 is formed by performing a dry etching process to expose the pad electrode 17.

In this case, the resist film PR8 is in a pattern having an opening in the region of the vibrating electrode 17c and the region of the air gap 15v2 in the MEMS element region R1. Thereby, the above-described etching process forms an opening part communicating with the air gap 15v1 in the MEMS element region R1, and thus forms a diaphragm structure DF.

In addition, a pad opening part P2 for the fixed electrode 18a is formed, the pad opening part P2 reaching the air gap 15v2.

The above-described etching is performed so as not to remove the pad electrode 17 or the vibrating electrode 17c and so as to reach the air gaps 15v1 and 15v2.

The resist film PR8 for the pad opening is removed.

Subsequent manufacturing is performed in a similar manner to a method for manufacturing an ordinary solid-state image pickup apparatus.

Thus, the solid-state image pickup apparatus having the MEMS element formed or combined on the same substrate shown in FIG. 7 can be manufactured.

According to the method for manufacturing the solid-state image pickup apparatus, the MEMS element can be easily formed on the same chip as the solid-state image pickup apparatus, and the device can be miniaturized by reducing the mounting area of the device.

First Example of Modification

Constitution of Solid-State Image Pickup Apparatus

Figure 10:
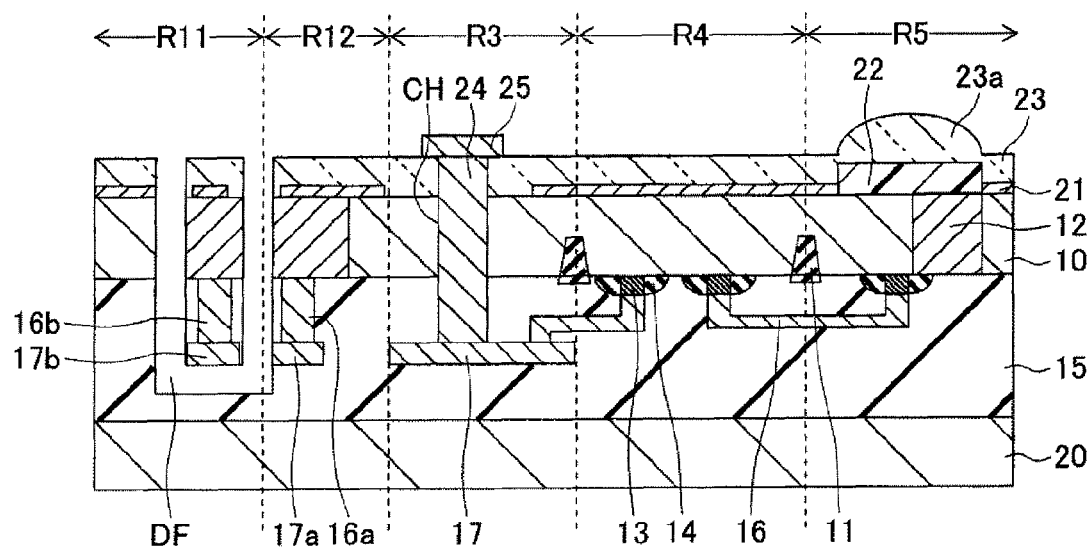
FIG. 10 is a schematic sectional view of a solid-state image pickup apparatus according to a first example of modification.

FIG. 10 is a schematic sectional view of a solid-state image pickup apparatus according to a first example of modification.

The solid-state image pickup apparatus according to the present embodiment has a similar constitution to that of the solid-state image pickup apparatus according to the first embodiment. However, a contact hole CH reaching a pad electrode is formed in place of a pad opening part, a plug 24 is embedded within the contact hole CH, and upper wiring 25 is connected to the plug 24.

The pad opening part P is not necessarily required in the first to third embodiments described above. The diaphragm structure of a MEMS element can be formed at the same time as the process of making the contact hole CH.

In addition to the above, a via hole may be formed in place of the contact hole.

Second Example of Modification

Constitution of Solid-State Image Pickup Apparatus

Figure 11A:
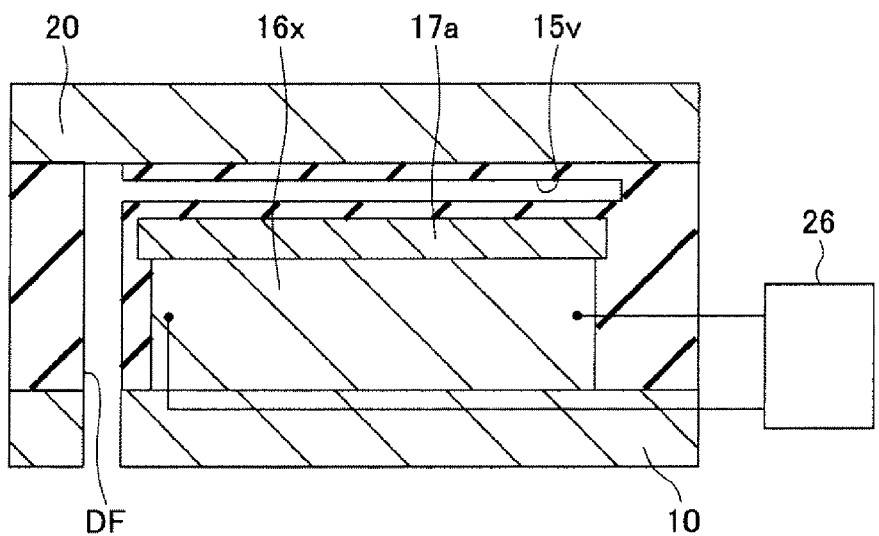
FIGS. 11A and 11B are schematic sectional views of a solid-state image pickup apparatus according to a second example of modification.
Figure 11B:
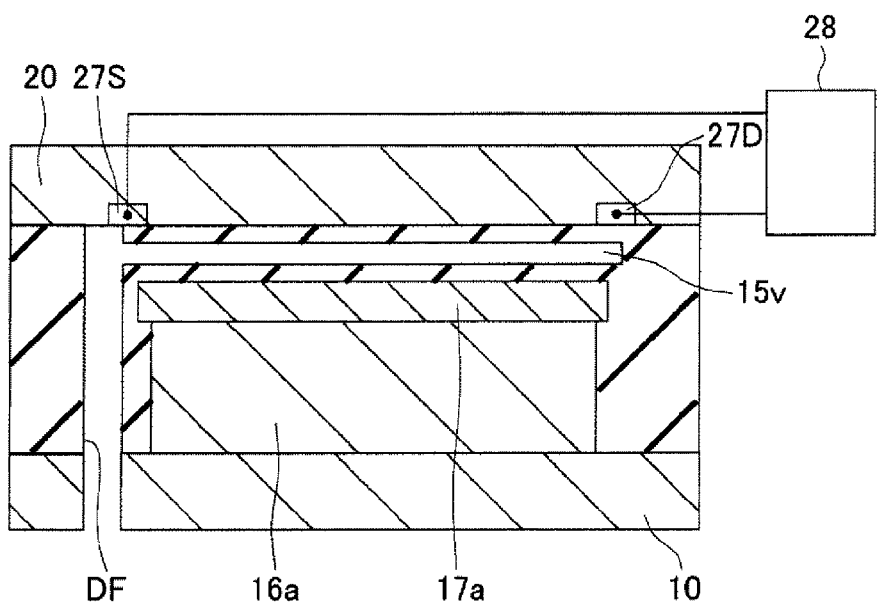

FIGS. 11A and 11B are schematic sectional views of a solid-state image pickup apparatus according to a second example of modification.

The solid-state image pickup apparatus according to the present embodiment has a similar constitution to that of the solid-state image pickup apparatus according to the first embodiment. However, a MEMS element is not a parallel plate type capacitance element but a piezoelectric element or a MOS type position sensor.

A MEMS element shown in FIG. 11A uses a piezoelectric film 16x as a vibrating electrode.

FIG. 11A corresponds to the section of FIG. 2D in the first embodiment. The position of the vibrating electrode is variable according to an inertial force, vibration, or the like. Thus, an electromotive force occurs in the piezoelectric film when the vibrating electrode 16x vibrates. The displacement of the vibrating electrode is sensed by detecting the electromotive force by a detecting circuit 26, so that the inertial force or the vibration can be measured.

In a MEMS element shown in FIG. 11B, a source 27S and a drain 27D are formed in a surface on the vibrating electrode side of a supporting substrate 20. A MOS transistor having a vibrating electrode as a gate electrode is formed.

FIG. 11B corresponds to the section of FIG. 2D in the first embodiment. The position of the vibrating electrode is variable according to an inertial force, vibration, or the like. Thus, the drain current of the MOS transistor changes when the vibrating electrode 16a vibrates. The displacement of the vibrating electrode is sensed by detecting the drain current by a detecting circuit 28, so that the inertial force or the vibration can be measured.

Fourth Embodiment

Application to Electronic Device

Figure 12:
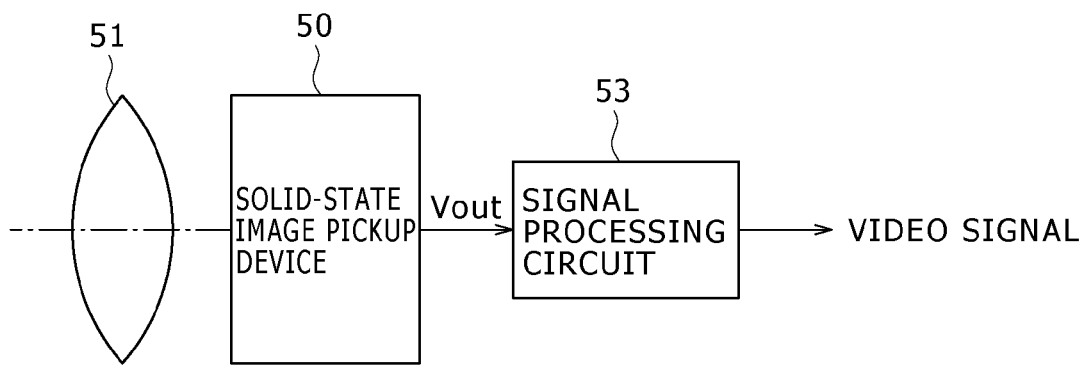
FIG. 12 is a schematic block diagram of an electronic device according to a fourth embodiment.

FIG. 12 is a schematic block diagram of an electronic device as an electronic device according to the present embodiment. The electronic device according to the present embodiment is an example of a video electronic device capable of photographing a still image or photographing a moving image.

The electronic device according to the present embodiment has an image sensor (solid-state image pickup apparatus) 50, an optical system 51, a signal processing circuit 53, and the like.

In the present embodiment, the solid-state image pickup apparatus according to the foregoing first embodiment is incorporated as the above-described image sensor 50.

The image sensor 50 forms an image of image light (incident light) from a subject onto the image pickup surface of the image sensor 50. Thereby a corresponding signal charge is accumulated within the image sensor 50 in a certain period. The accumulated signal charge is extracted as an output signal Vout.

A shutter device controls a period of irradiation of the image sensor 50 with light and a period of shielding the image sensor 50 from light.

The image processing section supplies a driving signal for controlling the transfer operation of the image sensor 50 and the shutter operation of the shutter device. The signal transfer of the image sensor 50 is performed according to the driving signal (timing signal) supplied from the image processing section. The signal processing circuit 53 subjects the output signal Vout of the image sensor 50 to various signal processing, and then outputs the result as a video signal. The video signal resulting from the signal processing is stored on a storage medium such as a memory or the like, or output to a monitor.

According to the electronic device according to the embodiment described above, it is possible to reduce variations in light interference intensity of light incident on a light receiving surface and suppress color non-uniformity in an electronic device having a solid-state image pickup apparatus for picking up a color image of a generation with a cell pitch of 3 μm or less, in particular, for example.

The foregoing embodiment has been described by taking as an example a case of application to the image sensor 50 in which unit pixels for sensing a signal charge corresponding to an amount of visible light as a physical quantity are arranged in the form of a matrix. However, the present disclosure is not limited to application to the image sensor 50. The present disclosure is applicable to solid-state image pickup apparatuses in general of a column system which devices are formed with column circuits arranged for each pixel column of a pixel array section.

In addition, the present disclosure is not limited to application to solid-state image pickup apparatuses for sensing a distribution of amounts of incident visible light and picking up the distribution as an image. The present disclosure is applicable to solid-state image pickup apparatuses for picking up a distribution of infrared rays, X-rays, or amounts of incidence of particles or the like and, in a broad sense, solid-state image pickup apparatuses (physical quantity distribution sensing devices) in general such as fingerprint detecting sensors and the like for sensing a distribution of another physical quantity such as pressure, capacitance or the like, and picking up the distribution as an image.

In addition, the present disclosure is not limited to application to solid-state image pickup apparatuses, but is applicable to for example digital still electronic devices, video electronic devices, and electronic devices having an image pickup function such as portable telephones and the like. Incidentally, there may be cases where the form of the above-described module mounted in an electronic device, that is, an electronic device module is treated as an image pickup device.

The image sensor 50 according to the embodiment described above can be used as solid-state image pickup apparatuses of video electronic devices, digital still electronic devices, and electronic device modules for mobile devices such as portable telephones and the like.

The solid-state image pickup apparatus according to each of the foregoing embodiments and the method for manufacturing the solid-state image pickup apparatus have the following advantages.

By integrating an image sensor and a position sensor/microphone on one chip rather than creating the image sensor and the position sensor/microphone separately from each other, the number of times of mounting of a sensor chip into a camera module are reduced from two or three to one, and thus a decrease in yield at the time of mounting can be reduced.

A module common to the position controlling circuit of a position sensor or the audio converting circuit of a microphone and a circuit for processing the image of an image sensor can be shared. Thus, a chip area is smaller than in the case of producing the image sensor and the position sensor/microphone separately from each other, and the cost of the module can be reduced.

By integrating an image sensor and a position sensor or a microphone on one chip, a hand movement blur preventing function, a top and bottom determining function, an audio recording function and the like can be added to a camera module with little increase in mounting area and mounting volume. It is thereby possible to contribute to making portable devices provided with an image pickup function thinner and more compact.

When an image sensor and a position sensor are integrated into one chip, both an image obtained by the image sensor and the information of the position sensor can be processed within the one chip. It is thereby possible to perform position control for preventing hand movement blurring, which control uses both the image information of the image sensor and the information of the position sensor, at low cost without increasing wiring cost.

The present disclosure is not limited to the above description.

For example, the present disclosure is applicable to both CMOS image sensors and CCD image sensors as solid-state image pickup apparatuses.

In addition, the present disclosure is not limited to solid-state image pickup apparatuses of a back-illuminated type, but is also applicable to solid-state image pickup apparatuses of an ordinary front-illuminated type.

Besides, various changes can be made without departing from the spirit of the present disclosure. It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2010-116461 filed in the Japan Patent Office on May 20, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state image pickup device, said method comprising:
    designating at least a Micro Electro Mechanical Systems (MEMS) device region and a solid state image pickup region on a device substrate;
    forming a MEMS device on the MEMS device region;
    forming a solid-state image pickup device on the solid-state image pickup region while forming the MEMS device;
    forming an insulating film on the device substrate;
    forming an electrode for the MEMS device in the insulating film;
    forming a gap in the insulating film to expose a portion of the electrode; and
    securing a supporting substrate over the insulating film in the MEMS device region and solid-state imaging device region.

2. The method of claim 1, further comprising:
    forming openings in the device substrate, the openings being in communication with the gap to form a diaphragm structure for the electrode,
    wherein the electrode is a vibrating electrode.

3. The method of claim 1, further comprising:
    forming a pad electrode on the device substrate, the pad electrode being electrically connected to the solid-state image pickup device; and
    forming an opening in the device substrate, the opening exposing a portion of the pad electrode.

4. A method of manufacturing a solid-state image pickup device, said method comprising:
    designating at least a Micro Electro Mechanical Systems (MEMS) device region and a solid state image pickup region on a device substrate;
    forming an insulating layer on the device substrate;
    forming a MEMS device in the MEMS device region;
    forming a solid-state image pickup device in the solid-state image pickup region while forming the MEMS device;
    forming a gap in the insulating layer exposing a portion of the MEMS device; and
    securing a supporting substrate over the MEMS device region and solid-state imaging device region,
    wherein the gap, formed in the MEMS device region and exposing a portion of the MEMS device, remains in the insulating layer.

5. A solid-state image pickup apparatus comprising:
    a substrate;
    a solid-state image pickup device; and
    a Micro Electro Mechanical Systems (MEMS) device,
    wherein,
        the solid-state image pickup device and the MEMS device are formed on the same substrate,
        a light receiving side of the solid-state image pickup device is provided on a first side of the substrate, and
        a parallel plate capacitance element of the MEMS device is provided on a second side of the substrate.

6. The solid-state image pickup device of claim 5, wherein the parallel plate capacitance element includes a vibrating electrode and a fixed electrode.

7. An electronic device comprising:
    (a) a solid-state image pickup apparatus including
        (i) a substrate;
        (ii) a solid-state image pickup device; and
        (iii) a Micro Electro Mechanical Systems (MEMS) device; and
    (b) a circuit to process signals generated by the solid-state image pickup device,
    wherein,
        the solid-state image pickup device and the MEMS device are formed on the same substrate,
        the solid-state image pickup apparatus includes a pad electrode that is electrically connected to the solid-state image pickup device, and
        the substrate includes an opening that exposes a portion of the pad electrode.

8. An electronic device comprising:
    (a) a solid-state image pickup apparatus including
        (i) a substrate;
        (ii) a solid-state image pickup device; and
        (iii) a Micro Electro Mechanical Systems (MEMS) device; and
    (b) a circuit to process signals generated by the solid-state image pickup device,
    wherein,
        the solid-state image pickup device and the MEMS device are formed on the same substrate, and
        the MEMS device includes a vibrating electrode and a fixed electrode, said substrate having an opening between the vibrating electrode and the fixed electrode.

9. An electronic device comprising:
    (a) a solid-state image pickup apparatus including
        (i) a substrate;
        (ii) a solid-state image pickup device; and
        (iii) a Micro Electro Mechanical Systems (MEMS) device;
    (b) a circuit to process signals generated by the solid-state image pickup device; and
    a supporting substrate secured to the MEMS device and the solid-state image pickup device,
    wherein,
        the solid-state image pickup device and the MEMS device are formed on the same substrate, and
        the MEMS device includes an air gap between the substrate and the supporting substrate.

10. The electronic device of claim 9,
wherein the substrate includes openings that are in communication with said air gap.

11. The electronic device of claim 9, further comprising:
an insulating film between the substrate and the supporting substrate,
wherein said air gap is formed in the insulating film.

12. The electronic device of claim 11, further comprising:
a vibrating electrode embedded in the insulating film,
wherein said vibrating electrode is between said air gap and said substrate.

* * * * *